United States Patent
Hyde et al.

(10) Patent No.: US 9,240,230 B2
(45) Date of Patent: Jan. 19, 2016

(54) BIPOLAR LOGIC GATES ON MOS-BASED MEMORY CHIPS

(71) Applicant: Elwha LLC, Bellevue, WA (US)

(72) Inventors: Roderick A. Hyde, Redmond, WA (US); Jordin T. Kare, San Jose, CA (US); Lowell L. Wood, Jr., Bellevue, WA (US)

(73) Assignee: Elwha LLC, Bellevue, WA (US)

( * ) Notice: Subject to any disclaimer, the term of this patent is extended or adjusted under 35 U.S.C. 154(b) by 0 days.

(21) Appl. No.: 14/801,700

(22) Filed: Jul. 16, 2015

(65) Prior Publication Data

US 2015/0325276 A1 Nov. 12, 2015

Related U.S. Application Data

(62) Division of application No. 13/660,851, filed on Oct. 25, 2012, now Pat. No. 9,117,499.

(51) Int. Cl.
*G11C 8/10* (2006.01)
*G11C 11/4067* (2006.01)
*G11C 11/414* (2006.01)

(52) U.S. Cl.
CPC ............ *G11C 8/10* (2013.01); *G11C 11/4067* (2013.01); *G11C 11/414* (2013.01)

(58) Field of Classification Search
CPC ..... G11C 11/4067; G11C 11/414; G11C 8/10
See application file for complete search history.

(56) References Cited

U.S. PATENT DOCUMENTS

| | | | |
|---|---|---|---|
| 4,586,167 A | 4/1986 | Fujishima et al. | |
| 4,665,509 A * | 5/1987 | Ooami et al. | G11C 8/06 365/230.06 |
| 4,819,207 A | 4/1989 | Sakui et al. | |
| 4,831,597 A | 5/1989 | Fuse | |
| 4,928,265 A | 5/1990 | Higuchi et al. | |
| 4,962,478 A | 10/1990 | Masuda | |
| 4,986,666 A | 1/1991 | Homma et al. | |
| 5,005,153 A * | 4/1991 | Maejima et al. ...... | G06F 15/786 716/110 |
| 5,005,154 A | 4/1991 | Masuda | |
| 5,021,688 A | 6/1991 | Leforestier et al. | |
| 5,086,414 A | 2/1992 | Nambu et al. | |
| 5,208,779 A | 5/1993 | Walther et al. | |
| 5,241,503 A | 8/1993 | Cheng | |

(Continued)

OTHER PUBLICATIONS

Itoh, Kiyoo, "Trends in Megabit DRAM Circuit Design", IEEE Journal of Solid-State Circuits, vol. 25, No. 3, Jun. 1990, pp. 778-789.

(Continued)

*Primary Examiner* — Richard Elms
*Assistant Examiner* — Khamdan Alrobaie
(74) *Attorney, Agent, or Firm* — Foley & Lardner LLP

(57) ABSTRACT

A system for using selectable-delay bipolar logic circuitry within the address decoder of a MOS-based memory includes a MOS-based memory, which includes an array of a plurality of memory cells configured to store data; an address decoder including bipolar logic circuitry, where the address decoder is configured to accept a word including a plurality of bits and access the array of memory cells using the word; where the bipolar logic circuitry includes a plurality of bipolar transistor devices, where at least one bipolar transistor device has an adjustable gate bias and is configured to accept an input, wherein the gate bias is adjusted based on the input, where the gate bias determines a selectable gate delay.

19 Claims, 5 Drawing Sheets

(56) References Cited

U.S. PATENT DOCUMENTS

| | | | |
|---|---|---|---|
| 5,317,541 A | | 5/1994 | Chan |
| 5,392,251 A | | 2/1995 | Manning |
| 5,402,382 A | * | 3/1995 | Miyawaki et al. ...... G11C 16/16 365/185.12 |
| 5,638,317 A | | 6/1997 | Tran |
| 5,680,066 A | | 10/1997 | Akioka et al. |
| 5,696,715 A | | 12/1997 | Maejima et al. |
| 5,740,121 A | | 4/1998 | Suzuki et al. |
| 5,835,401 A | | 11/1998 | Green et al. |
| 5,892,726 A | | 4/1999 | Moon et al. |
| 5,963,469 A | | 10/1999 | Forbes |
| 6,043,527 A | | 3/2000 | Forbes |
| 6,317,357 B1 | | 11/2001 | Forbes |
| 2006/0117155 A1 | | 6/2006 | Ware et al. |
| 2009/0016106 A1 | * | 1/2009 | Tran et al. .............. G11C 16/28 365/185.05 |
| 2010/0128549 A1 | | 5/2010 | Dudeck et al. |
| 2010/0131725 A1 | | 5/2010 | Perego et al. |

OTHER PUBLICATIONS

Kawahara et al., "Deep-Submicrometer BiCMOS Circuit Technology for Sub-10-ns ECL 4-Mb DRAM's", IEEE Journal of Solid-State Circuits, vol. 27, No. 4, Apr. 1992, pp. 589-596.

Kawahara et al., "Substrate Current Reduction Techniques for BiCMOS DRAM" IEEE Journal of Solid-State Circuits, vol. 24, No. 5, Oct. 1989, pp. 1381-1389.

Kitsukawa et al., "A 23-ns 1-Mb BiCMOS DRAM", IEEE Journal of Solid-State Circuits, vol. 25, No. 5, Oct. 1990, pp. 1102-1111.

Kitsukawa et al., "An Experimental 1-Mbit BiCMOS DRAM" IEEE Journal of Solid-State Circuits, vol. Sc-22, No. 5, Oct. 1987, pp. 657-662.

Kobayashi et al., "Bipolar CMOS-merged Technology for a High-Speed 1-Mbit DRAM", IEEE Transactions on Electron Devices, vol. 36, No. 4, Apr. 1989, pp. 706-711.

Kubo et al., "Perspective on BiCMOS VLSI's", IEEE Journal of Solid-State Circuits, vol. 23. No. 1, Feb. 1988, pp. 5-11.

PCT International Search Report; International App. No. PCT/US2014/066525; Feb. 10, 2014; pp. 1-3.

Silburt et al., "A 180-MHz 0.8-3BCm BiCMOS Modular Memory Family of DRAM and Multiport SRAM", IEEE Journal of Solid-State Circuits, vol. 28, No. 3, Mar. 1993, pp. 222-232.

Watanabe et al., "BiCMOS Circuit Technology for High-Speed DRAM's", IEEE Journal of Solid-State Circuits, vol. 28, No. 1, Jan. 1993, pp. 4-9.

Watanabe et al., "Comparison of CMOS and BiCMOS 1-Mbit DRAM Performance", IEEE Journal of Solid-State Circuits, vol. 24 No. 3, Jun. 1989, pp. 771-778.

* cited by examiner

BIPOLAR LOGIC GATES ON MOS-BASED MEMORY CHIPS

CROSS-REFERENCE TO RELATED APPLICATION

This application is a divisional of U.S. patent application Ser. No. 13/660,851, titled "BIPOLAR LOGIC GATES ON MOS-BASED MEMORY CHIPS" filed Oct. 25, 2012, the entire disclosure of which is incorporated herein by reference in its entirety for any and all purposes.

BACKGROUND

Memory chips have many-gates-deep, complementary metal-oxide-semiconductor (CMOS) decoder circuitry, which contributes greatly to memory access times. CMOS is a design method for constructing integrated circuits. It generally refers to the use of complementary and symmetrical pairs of p-type and n-type metal oxide semiconductor field effect transistors (MOSFETs), which are used to implement logic gates. A memory device implemented utilizing CMOS circuitry can be referred to as MOS-based. The access time of a MOS-based memory includes the time it takes for the decoder circuitry of the memory to decode a word address in order to retrieve data. Thus, there is a need to increase the speed of decoding circuitry.

SUMMARY

One exemplary embodiment relates to a system for using selectable-delay bipolar logic circuitry within the address decoder of a MOS-based memory. The system includes a MOS-based memory, which includes an array of a plurality of memory cells configured to store data; an address decoder comprising bipolar logic circuitry, wherein the address decoder is configured to accept a word comprising a plurality of bits and access the array of memory cells using the word; and wherein the bipolar logic circuitry comprises a plurality of bipolar transistor devices, wherein at least one bipolar transistor device has an adjustable gate bias and is configured to accept an input, wherein the gate bias is adjusted based on the input, wherein the gate bias determines a selectable gate delay.

Another exemplary embodiment relates to a system for selectable-delay bipolar logic circuitry within the address decoder of a MOS-based memory. The system includes a MOS-based memory, which includes an array of a plurality of memory cells configured to store data; an address decoder comprising bipolar logic circuitry, wherein the address decoder is configured to accept a word comprising a plurality of bits and access the array of memory cells using the word; and wherein the bipolar logic circuitry comprises a plurality of bipolar transistor devices, wherein at least one bipolar transistor device has an adjustable gate bias; and an input, wherein the gate bias is adjusted based on the input, wherein the gate bias determines a selectable gate delay.

Another exemplary embodiment relates to a system for using alternatively selectable MOS-based and bipolar-based address decoders in a MOS-based memory. The system includes a MOS-based memory, which includes an array of a plurality of memory cells configured to store data; a MOS-based address decoder configured to accept a word comprising a plurality of bits and access the array of memory cells using the word; a bipolar-based address decoder comprising bipolar logic circuitry, wherein the bipolar-based address decoder is configured to accept a word comprising a plurality of bits and access the array of memory cells using the word; and memory controller circuitry configured to accept a selection input and use the selection input to select between the MOS-based address decoder and the bipolar-based address decoder.

Another exemplary embodiment relates to a system for using both MOS-based and bipolar-based decoding circuitry in an address decoder for MOS-based memory. The system includes a MOS-based memory, which includes an array of a plurality of memory cells configured to store data; an address decoder comprising MOS-based circuitry and bipolar logic circuitry; wherein the address decoder is configured to accept a word comprising a plurality of bits and access the array of memory cells using the word.

Another exemplary embodiment relates to a non-transitory computer-readable medium having instructions stored thereon, the instructions include instructions to monitor a MOS-based memory. The MOS-based memory includes an array of a plurality of memory cells configured to store data; an address decoder comprising an input configured to adjust the address decoder, MOS-based circuitry, and bipolar logic circuitry comprising a plurality of bipolar transistor devices, wherein at least one bipolar transistor device has an adjustable gate bias, wherein the gate bias is adjusted based on the input, wherein the gate bias determines a selectable gate delay. The MOS-based circuitry and bipolar logic circuitry are selectable based on the input. The instructions further include instructions to adjust the input based on the monitoring.

Another exemplary embodiment relates to a non-transitory computer-readable medium having instructions stored thereon, the instructions include instructions to monitor a MOS-based memory. The MOS-based memory includes an array of a plurality of memory cells configured to store data, an address decoder comprising bipolar logic circuitry, wherein the address decoder is configured to accept a word comprising a plurality of bits and access the array of memory cells using the word, and an input. The bipolar logic circuitry comprises a plurality of bipolar transistor devices, wherein at least one bipolar transistor device has an adjustable gate bias, and an input, wherein the gate bias is adjusted based on the input, wherein the gate bias determines a selectable gate delay. The instructions further include instructions to adjust the input based on the monitoring.

The invention is capable of other embodiments and of being carried out in various ways. Alternative embodiments relate to other features and combinations of features as may be generally recited in the claims.

The foregoing is a summary and thus by necessity contains simplifications, generalizations and omissions of detail. Consequently, those skilled in the art will appreciate that the summary is illustrative only and is not intended to be in any way limiting. Other aspects, inventive features, and advantages of the devices and/or processes described herein, as defined solely by the claims, will become apparent in the detailed description set forth herein and taken in conjunction with the accompanying drawings.

BRIEF DESCRIPTION OF THE FIGURES

The invention will become more fully understood from the following detailed description taken in conjunction with the accompanying drawings wherein like reference numerals refer to like elements, in which.

DETAILED DESCRIPTION

Figure 1:
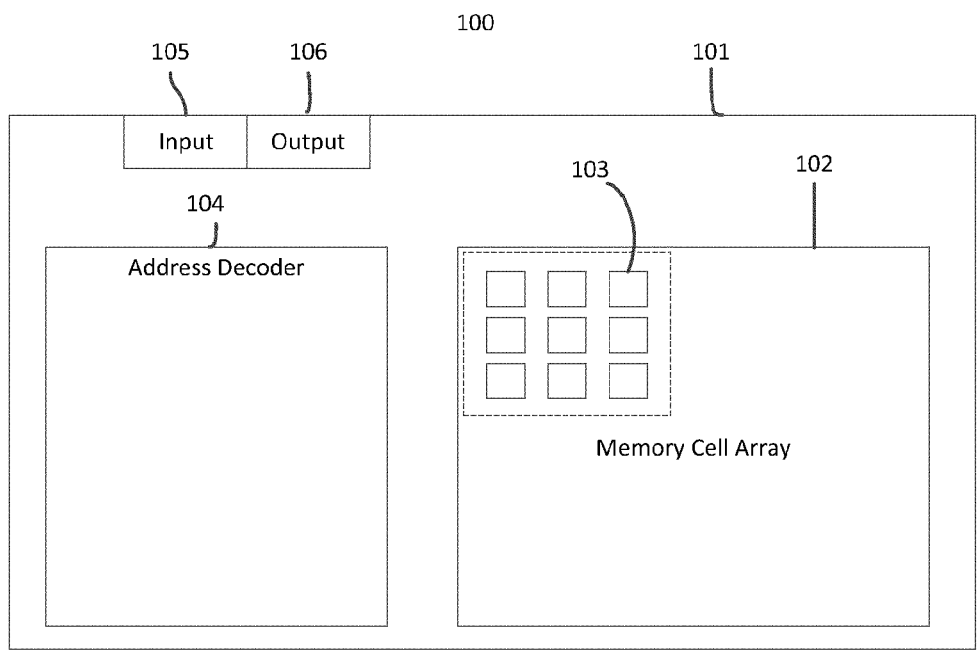
FIG. 1 is a block diagram of a system for using selectable-delay bipolar logic circuitry within the address decoder of a MOS-based memory, including an address decoder and a memory cell array, configured for using the systems and methods of this disclosure, shown according to an exemplary embodiment.

Before turning to the figures, which illustrate the exemplary embodiments in detail, it should be understood that the application is not limited to the details or methodology set forth in the description or illustrated in the figures. It should also be understood that the terminology is for the purpose of description only and should not be regarded as limiting.

Referring generally to the figures, systems for MOS-based memory devices that utilize bipolar logic circuitry are shown. MOS-based memory traditionally uses address decoders to access data stored within memory cells. Address decoder circuitry includes many CMOS logic gates, each having corresponding gate delays, which in turn largely contribute to overall memory access times. Bipolar logic circuitry, with comparatively smaller gate delays may be used in conjunction with CMOS circuitry, or may replace the CMOS circuitry of an address decoder. By using bipolar logic circuitry, the overall access time of a MOS-based memory device may be decreased. Various bipolar technologies may be used to implement the systems described herein (e.g., bipolar CMOS transistors, (BiCMOS), silicon-germanium heterojunction bipolar transistors (SiGe HBTs), bipolar junction transistor (BJTs), etc.). It should be understood that the scope of this application is not limited to a specific type of bipolar technology.

Bipolar gates may have adjustable gate delays. The gate delay of a bipolar transistor corresponds to the transistor's gate bias. Adjusting the gate bias alters the gate delay. For example, if a gate bias voltage of a bipolar transistor is increased, its corresponding gate delay will decrease. On the other hand, if the gate bias voltage is decreased, the corresponding gate delay will increase. Heat also affects the gate delay. There may be situations where faster speed is desired, and there may be other situations where less power usage is desired. By controlling the gate biases of bipolar transistors, the appropriate tradeoff between speed and power usage may be reached for a given situation. Alternatively, control of gate bias may be based on user settings, timing or synchronization requirements between the memory and other components, or based upon operational needs for given calculations, software determinations, etc.

The selection of a gate delay may be a static or dynamic selection. The selection may occur during the fabrication process by selection between multiple delay choices (e.g., selection of an adjustable bias voltage). The delay selection can be made after fabrication by selection between discrete values, or by selection of a continuously adjustable value within a range. The selection of a gate delay and adjustment of a gate bias may be a static decision (e.g., a fixed selection of bias voltage to be applied by a PC board), or it may be a dynamic decision (e.g., a value selected may be changed by user during or between operations, calculations, etc.).

According to one contemplated scenario, the processor of a laptop computer is configured to monitor the battery life of the laptop. The processor may detect that the battery of the laptop is low. In order to decrease power usage and preserve battery life, the processor may send signals to decrease the gate bias voltage being used by the bipolar logic circuitry within the address decoder of the memory device of the laptop. According to another contemplated scenario, a control system may determine that the execution speed of a given piece of software is being limited by memory accesses in a set of RAM chips. It may then increase the gate bias voltage to the address decoders in these chips in order to speed up memory accesses by a specified amount. In making this decision, the control system may tradeoff the cost of the speedup (e.g., energy usage, battery charge, etc.) relative to the benefit (e.g., amount of the speedup, etc.).

Bipolar logic gates may be used to implement a bipolar-based address decoder. A bipolar-based address decoder may be used in conjunction with, or in place of a CMOS-based address decoder. Address decoders of different types (bipolar-based, CMOS-based, mixed, etc.) may also be selected according to considerations as described herein. The selection of different decoder types to be used may be made during the fabrication process. Alternatively, a device may fabricated with both bipolar-based and CMOS-based decoders. Such a device may select between decoder types as described herein.

According to another contemplated scenario, a device may be fabricated with a certain configuration according to a customer's requirements. In this scenario the customer may desire the quickest memory access speed possible. The customer may configure a device made only with bipolar-based address decoders, each configured for maximum speed.

According to another contemplated scenario, a customer may desire a flexible device. The customer may configure a device made bipolar-based address decoders that can be dynamically adjusted to provided a balance between speed and power usage.

For purposes of this disclosure, the term "coupled" means the joining of two members directly or indirectly to one another. Such joining may be stationary in nature or moveable in nature and such joining may allow for the flow of fluids, electricity, electrical signals, or other types of signals or communication between the two members. Such joining may be achieved with the two members or the two members and any additional intermediate members being integrally formed as a single unitary body with one another or with the two members or the two members and any additional intermediate members being attached to one another. Such joining may be permanent in nature or alternatively may be removable or releasable in nature.

Referring to FIG. 1, a block diagram for a system 100 of MOS-based memory 101 with a selectable-delay bipolar logic address decoder 104 is shown, configured for using the systems of this disclosure. Memory cell array 102, memory cells 103, input 105, and output 106 are also shown. MOS-based memory 101 may be configured as static random-access memory (SRAM), dynamic random-access memory (DRAM), or any other suitable random-access memory (RAM) configuration. MOS-based memory 101 includes all components and circuitry necessary to facilitate communications between the various modules of the memory (e.g., memory cell array 102, memory cells 103, address decoder 104, input 105, output 106, etc.) For additional discussion of memory systems and decoder technologies, see, Kiyoo Itoh, *VLSI Memory Chip Design* (*Springer Series in Advanced Microelectronics*) (2010); Bruce Jacob et al., *Memory Systems: Cache, DRAM, Disk* (2008); Brian Holdsworth & Clive Woods, *Digital Logic Design* (4th ed. 2002).

According to an exemplary embodiment, MOS-based memory 101 is a DRAM chip coupled to a PC motherboard, configured for use in a desktop computer. Address decoder 104 is the row decoder of the memory. Memory cell array 102 includes the data storage components. Input 105 and output 106 are the pin connectors of the DRAM chip.

According to another exemplary embodiment, MOS-based memory 101 is a SRAM chip coupled to a peripheral device, configured for use in a laptop computer. Address decoder 104 is the column decoder of the memory. Memory cell array 102 includes the data storage components (e.g., memory cells 103). Input 105 and output 106 are the pin connectors of the SRAM chip.

It should be understood that a memory device is not limited to containing one address decoder. The scope of the present disclosure encompasses any number of address decoders used individually or in combination.

MOS-based memory 101 includes address decoder 104. Address decoder 104 may be an n-to-$2^n$ decoder. For example, address decoder may be a 2-to-4 decoder, a 3-to-8 decoder, or a 4-to-16 decoder, etc. As another example, address decoder may be a 3-to-8 decoder that is formed from two 2-to-4 decoders. In an exemplary embodiment, address decoder 104 is a row decoder, configured to accept a word, decode the word, and access the appropriate row of memory cell array 102. The word is made of a plurality of bits and corresponds to a memory address. In another exemplary embodiment, address decoder 104 is a column decoder, configured to accept a word, decode the word, and access the appropriate column of memory cell array 102. In yet another exemplary embodiment, address decoder 104 may be configured as either a static or dynamic decoder. For additional discussion of decoding technologies, see, G. Samson et al., *Low-Power Dynamic Memory Word Line Decoding for Static Random Access Memories*, Proc. IEEE J. Solid-State Circuits, vol. 43, pp. 2524-2532 (November 2008).

Address decoder 104 includes all logic and circuitry to implement a decoding circuit. Address decoder 104 includes any number of logic gates. The logic gates of address decoder 104 are implemented using bipolar logic circuitry. The bipolar logic circuitry includes any number of bipolar transistor devices, configured to implement logic gates. The logic gates may be multi-port logic gates. Any suitable bipolar transistor device may be used to implement a logic gate. For example the bipolar transistors devices may be BiCMOS devices, HBT devices, SiGe HBT devices, BJT devices, etc. The bipolar transistor devices may also include any combination of different bipolar transistor devices. The bipolar transistor devices may be used to implement address decoders using Current Mode Logic. For additional discussion of Current Mode Logic, see, Nicholas LiCausi, *A Survey of SRAM Performance Enhancements*, Rensselaer Polytechnic Institute (July, 2007). It should be understood that the scope of the present disclosure is not limited to a particular type of bipolar transistor device.

Figure 3:
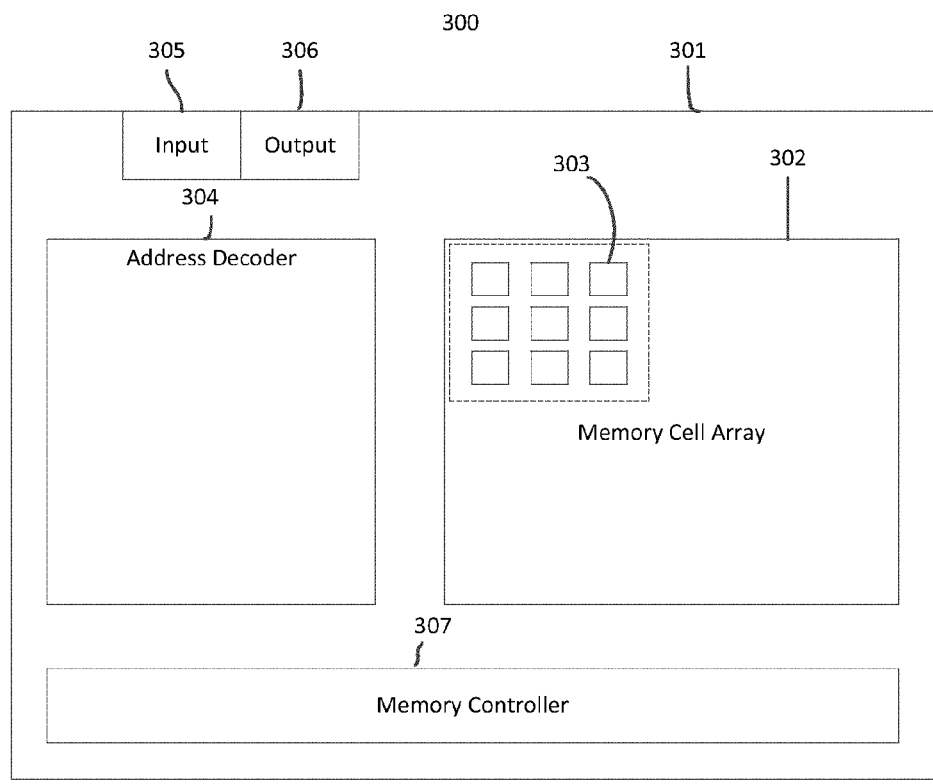
FIG. 3 is a block diagram of a system for using selectable-delay bipolar logic circuitry within the address decoder of a MOS-based memory, including an address decoder, a memory cell array, and a memory controller, configured for using the systems and methods of this disclosure, shown according to an exemplary embodiment.

The gate delay can be associated with a frequency response determined when using the gate in an oscillator circuit, such as within a microwave amplifier. Each logic gate also has a corresponding gate bias, i.e., a voltage bias applied across the transistor's junction. The gate bias may correspond to a voltage applied between the base and emitter of the transistor, or to a voltage applied between the base and collector. The gate delay of bipolar transistors depends upon its materials, physical layout, and also upon operational parameters such as the current, the gate bias, and the temperature. These operational parameters are interrelated, for example, at a given temperature, the collector current (or its related current density) is responsive to the gate bias (both the base-to-emitter voltage and the base-to-collector one). The relationship between current and gate bias will change with temperature; hence the current resulting from a given gate bias will depend upon temperature, as will the gate bias required to achieve a given current. For a given transistor or logic gate these relationships can be modeled either analytically or computationally, or can be measured experimentally; the relationships for commercially available devices are generally available from the manufacturer or supplier. Since the power usage by a bipolar transistor depends more directly upon the current (e.g., the collector current) than the gate biases or the temperature, it is often customary to present gate delay (or frequency) results at a given temperature in terms of the collector current. However, since this current is causally related to corresponding gate bias voltages, a relation between gate delay and current can be mapped into a corresponding relationship between gate delay and gate biases. Examples of such relationships for representative SiGe HBTs (expressed as plots of frequency versus collector current) are illustrated in FIG. 3 of Jae-Sung Rieh, *A Brief Overview of Modern High-Speed SiGe HBTs*, 8th International Conference on Solid-State and Integrated Circuit Technology, pp. 170-173 (October 2006) and in FIG. 7 of D. L. Harame et al., *Current Status and Future Trends of SiGe BiCMOS Technology*, IEEE Transactions on Electron Devices, vol. 48, pp. 2575-2594 (November 2001). For additional discussion of heterojunction bipolar transistors, see, John McMacken et al., *HBT Modeling Compact Modeling of III-V Heterojunction Bipolar Transistors for PA Applications*, IEEE Microwave, vol. 9, pp. 48-71 (April 2008).

The bipolar transistor devices may each be configured to accept an input used to adjust their gate delay. For example, a gate delay of bipolar transistor devices may be selected by using the input to change the gate bias. A gate bias voltage may be decreased, and the corresponding gate delay may increase. In this configuration, a device constructed with these gates may run slower, however, having a lower collector current, it may use less power. As another example a gate bias voltage may be increased, and the corresponding gate delay may decrease. In this configuration, a device constructed with these gates may run faster, however, it may use more power. In many cases, as demonstrated by the above references, the gate delay may be minimized (or, the frequency may be maximized) for one value of collector current, but the delay may remain relatively close to this optimum for significantly smaller currents, e.g., one may pay only a 20% delay penalty in exchange for a 3-fold reduction in current or heating. In some embodiments, a device can utilize such tradeoffs, operating at a greater than achievable gate delay in exchange for a substantial reduction in power consumption or heating. The gate bias may be adjusted as described above in order to configure a device for a specific application.

Any number of input types may be used to adjust a gate bias, and the corresponding gate delay. For example, the input may be a discrete bias voltage. The input may be a range of bias voltages. The input may be applied heating or cooling. Any input type that is capable of adjusting a gate bias may be used. It should be understood that the scope of the present application is not limited to a specific type of input that is used to adjust a gate bias.

MOS-based memory 101 further includes memory cells 103. Memory cells 103 include all components necessary for storing a bit of data. For example, a memory cell may be constructed from six MOSFET transistors. The memory cell may have two states, used to store a binary 0 or 1. Any number of memory cells 103 may be combined to form memory cell array 102. The scope of the present application is not limited to a certain number or configuration of memory cells 103.

MOS-based memory 101 further includes input 105 and output 106. Output 106 is configured to provide an output to a device as described herein. For example, output 106 may be coupled to a PC motherboard. The motherboard may be configured to accept data provided through output 106. In another example, output 106 may be coupled directly to a logic board of a peripheral device. Input 105 is configured to receive data. For example, input 105 may receive a byte of data to be stored in MOS-based memory 101. As another example, input 105 may receive a value that is used to adjust a gate delay of bipolar transistor devices within MOS-based memory 101. As another example, input 105 may receive a value that is used to select between bipolar transistor devices or MOS-based devices within address decoder 104. In an exemplary embodiment, input 105 and output 106 are coupled to the pin connectors of a RAM module.

Figure 2:
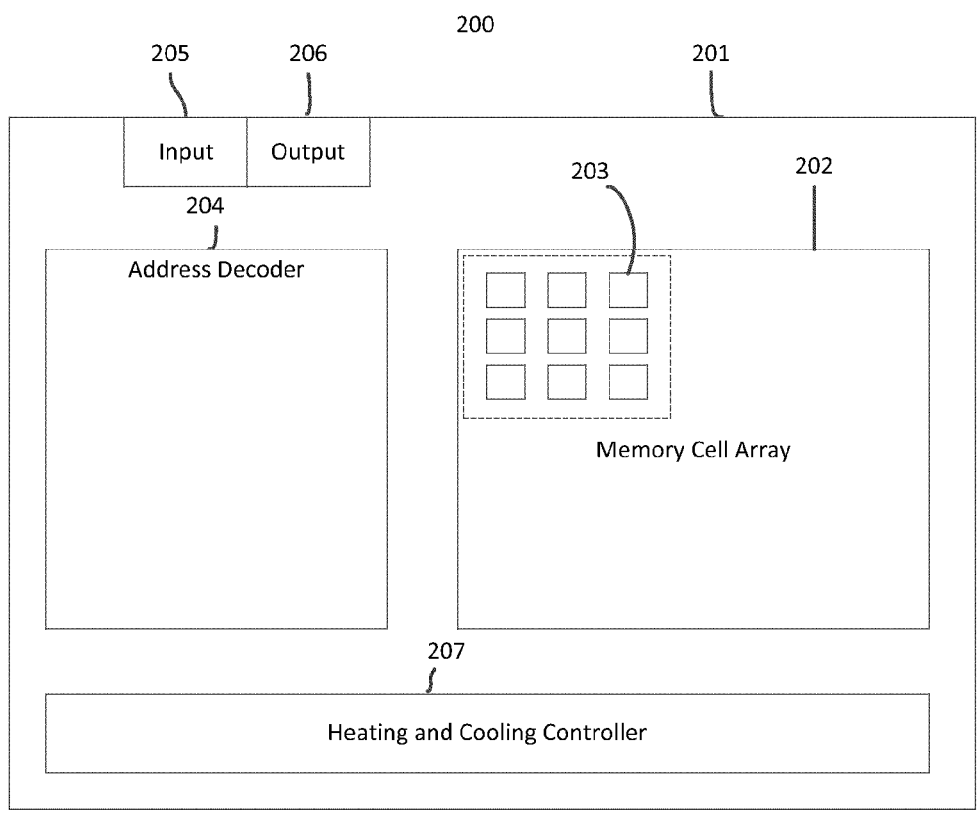
FIG. 2 is a block diagram of a system for using selectable-delay bipolar logic circuitry within the address decoder of a MOS-based memory, including an address decoder, a memory cell array, and a heating and cooling controller, configured for using the systems and methods of this disclosure, shown according to an exemplary embodiment.

Referring to FIG. 2, a block diagram for a system 200 of MOS-based memory 201 with a selectable-delay bipolar logic address decoder 204 is shown, configured for using the systems of this disclosure. Memory cell array 202, memory cells 203, input 205, output 206, and heating and cooling controller 207 are also shown. MOS-based memory 201 may be configured as static random-access memory (SRAM), dynamic random-access memory (DRAM), or any other suitable random-access memory (RAM) configuration. MOS-based memory 201 includes all components and circuitry necessary to facilitate communications between the various modules of the memory (e.g., memory cell array 202, memory cells 203, address decoder 204, input 205, output 206, heating and cooling controller 207, etc.)

MOS-based memory 201, memory cell array 202, memory cells 203, address decoder 204, input 205, and output 206 may be configured as MOS-based memory 101, memory cell array 102, memory cells 103, address decoder 104, input 105, and output 106 of FIG. 1, respectively, as described herein.

MOS-based memory 201 further includes heating and cooling controller 207. Heating and cooling controller 207 includes all components necessary for applying localized heating and cooling to the bipolar logic circuitry of address decoder 204. As an example, heating and cooling controller 207 may apply heat to the bipolar logic circuitry in order to increase the gate delays of the bipolar transistor devices therein. As another example, heating and cooling controller may cool the bipolar logic circuitry in order to decrease the gate delays of the bipolar transistor devices therein.

In an exemplary embodiment, heating and cooling controller 207 accepts input through input 205. The input may be a heat value supplied by the processor of a laptop computer. Heating and cooling controller 207 may use the heat value to adjust any heating or cooling to be supplied.

In another embodiment, heating and cooling controller 207 may monitor the localized temperature of environment around address decoder 204. Heating and cooling controller 207 may use monitored values to automatically adjust any heating or cooling to be supplied. For example, heating and cooling controller 207 may be configured to maintain an average localized temperature.

Referring to FIG. 3, a block diagram for a system 300 of MOS-based memory 301 with a selectable-delay bipolar logic address decoder 304 is shown, configured for using the systems of this disclosure. Memory cell array 302, memory cells 303, input 305, output 306, and memory controller 307 are also shown. MOS-based memory 301 may be configured as static random-access memory (SRAM), dynamic random-access memory (DRAM), or any other suitable random-access memory (RAM) configuration. MOS-based memory 301 includes all components and circuitry necessary to facilitate communications between the various modules of the memory (e.g., memory cell array 302, memory cells 303, address decoder 304, input 305, output 306, memory controller 307, etc.)

MOS-based memory 301, memory cell array 302, memory cells 303, address decoder 304, input 305, and output 306 may be configured as MOS-based memory 101, memory cell array 102, memory cells 103, address decoder 104, input 105, and output 106 of FIG. 1, respectively, as described herein.

MOS-based memory 301 further includes memory controller 307. Memory controller 307 may be used to dynamically adjust the gate delays of the bipolar transistor devices within address decoder 304. For example, memory controller 307 may provide the necessary signals to address decoder 304 in order to adjust the gate biases of the bipolar transistor devices therein. In one exemplary embodiment, memory controller 307 may receive an input through input 305 of a user setting. Memory controller 307 may then select a gate delay according to the user setting. As an example, MOS-based memory 301 may be the RAM of a laptop computer. A user setting may be provided from the processor of the laptop through input 305. The user setting may correspond to a setting intended to increase battery life of the laptop. In this manner, memory controller 307 may cause the gate bias voltage used by the bipolar transistor devices of address decoder 304 to be decreased, thereby reducing the overall power used by address decoder 304 and conserving the laptop's battery life.

In another exemplary embodiment, memory controller 307 actively monitors MOS-based memory 301. Memory controller 307 may dynamically adjust the gate delays of the bipolar transistor devices of address decoder 304. Memory controller 307 may also select and adjust delay values during or between memory operations, calculations, memory accesses, etc.

In another exemplary embodiment, memory controller 307 may base determinations to adjust the gate delays of the bipolar transistor devices of address decoder 304 on an algorithm. For example, delay values may be selected based on a tradeoff between speed and power dissipation of address decoder 304. As another example, delay values may be selected based on timing or synchronization requirements between MOS-based memory 301 and other components therein. As another example, delay values may be selected based on timing or synchronization requirements between MOS-based memory 301 and other components to which MOS-based memory 301 is coupled. As another example, delay values may be selected based upon operational needs for a calculation.

Figure 4:
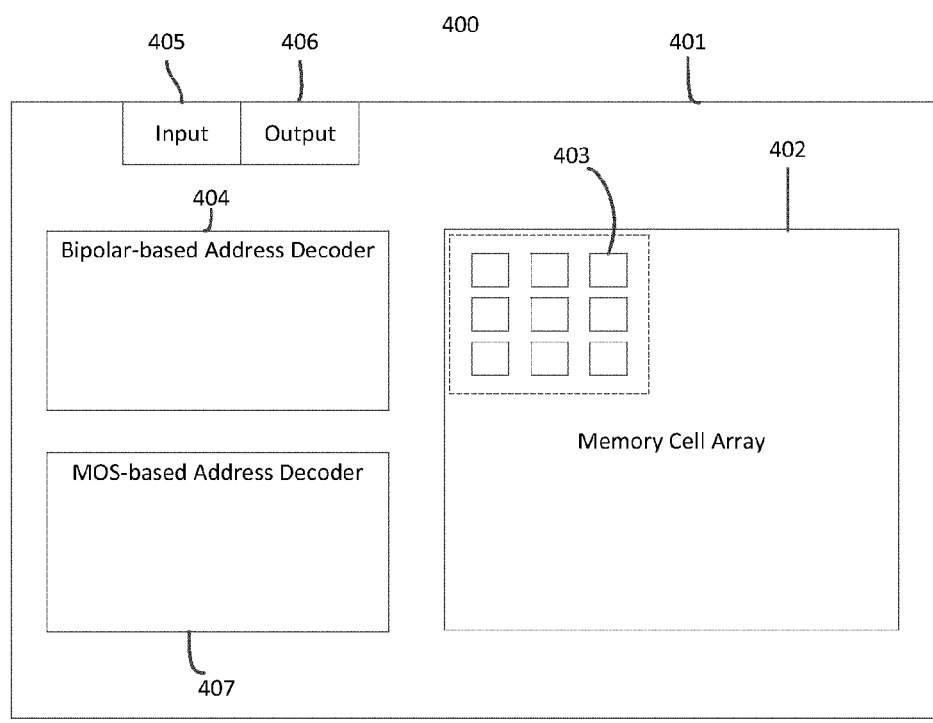
FIG. 4 is a block diagram of a system for using alternatively selectable MOS-based and bipolar-based address decoders in a MOS-based memory, a memory cell array, a MOS-based address decoder, and a bipolar-based address decoder, configured for using the systems and methods of this disclosure, shown according to an exemplary embodiment.

Referring to FIG. 4, a system 400 is shown for using alternatively selectable MOS-based and bipolar-based address decoders, 407 and 404, respectively, in MOS-based memory 401, configured for using the systems of this disclosure. Memory cell array 402, memory cells 403, input 405, and output 406 are also shown. MOS-based memory 401 may be configured as static random-access memory (SRAM), dynamic random-access memory (DRAM), or any other suitable random-access memory (RAM) configuration. MOS-based memory 401 includes all components and circuitry necessary to facilitate communications between the various modules of the memory (e.g., memory cell array 402, memory cells 403, bipolar-based address decoder 404, input 405, output 406, MOS-based address decoder 407, etc.)

MOS-based memory 401, memory cell array 402, memory cells 403, bipolar-based address decoder 404, input 405, and output 406 may be configured as MOS-based memory 101, memory cell array 102, memory cells 103, address decoder 104, input 105, and output 106 of FIG. 1, respectively, as described herein.

MOS-based memory 401 further includes MOS-based address decoder 407. MOS-based address decoder 407 includes all logic and circuitry to implement a decoding circuit. MOS-based address decoder 407 includes any number of logic gates. The logic gates of MOS-based address decoder 407 are implemented using CMOS circuitry. The CMOS circuitry includes any number of MOSFET transistor devices, configured to implement logic gates. The logic gates may be multi-port logic gates. Any suitable CMOS logic gate may be used.

Both bipolar-based address decoder 404 and MOS-based address decoder 407 may be used as row decoders, column decoders, or both, in order to access memory cell array 402. In one exemplary embodiment, bipolar-based address decoder 404 is used as a row decoder, and MOS-based address decoder 407 is used as a column decoder of MOS-based memory 401.

Both bipolar-based address decoder 404 and MOS-based address decoder 407 may be an n-to-$2^n$ decoder. For example, each address decoder may be a 2-to-4 decoder, a 3-to-8 decoder, or a 4-to-16 decoder, etc. As another example, both bipolar-based address decoder 404 and MOS-based address decoder 407 may be a 3-to-8 decoder that is formed from two 2-to-4 decoders. Bipolar-based address decoder 404 may be configured to implement the functionality as described by address decoder 104 of FIG. 1. Similar to bipolar-based address decoder 404, MOS-based address decoder 407 may be configured to accept a word, decode the word, and access the appropriate row of memory cell array 402. The word is made of a plurality of bits and corresponds to a memory address. MOS-based address decoder 407 may be either a static or dynamic decoder.

Selection between bipolar-based address decoder 404 and MOS-based address decoder 407 may be made during the fabrication process of a MOS-based memory 401 device. For example, MOS-based memory 401 may be fabricated with both bipolar-based address decoder 404 and MOS-based address decoder 407, however only one type of address decoder may be configured for communication with MOS-based memory 401. The decision to configure either bipolar-based address decoder 404 or MOS-based address decoder 407 for communication may depend on a customer's requirements.

MOS-based memory 401 includes input 405 and output 406. Output 406 is configured to provide an output to a device as described herein. For example, output 406 may be coupled to a PC motherboard. The motherboard may be configured to use data provided through output 406. In another example, output 406 may be coupled to a logic board of a peripheral device. Input 405 is configured to receive data from an electronic device. In an exemplary embodiment, input 405 and output 406 are coupled to the pin connectors of a RAM module.

Figure 5:
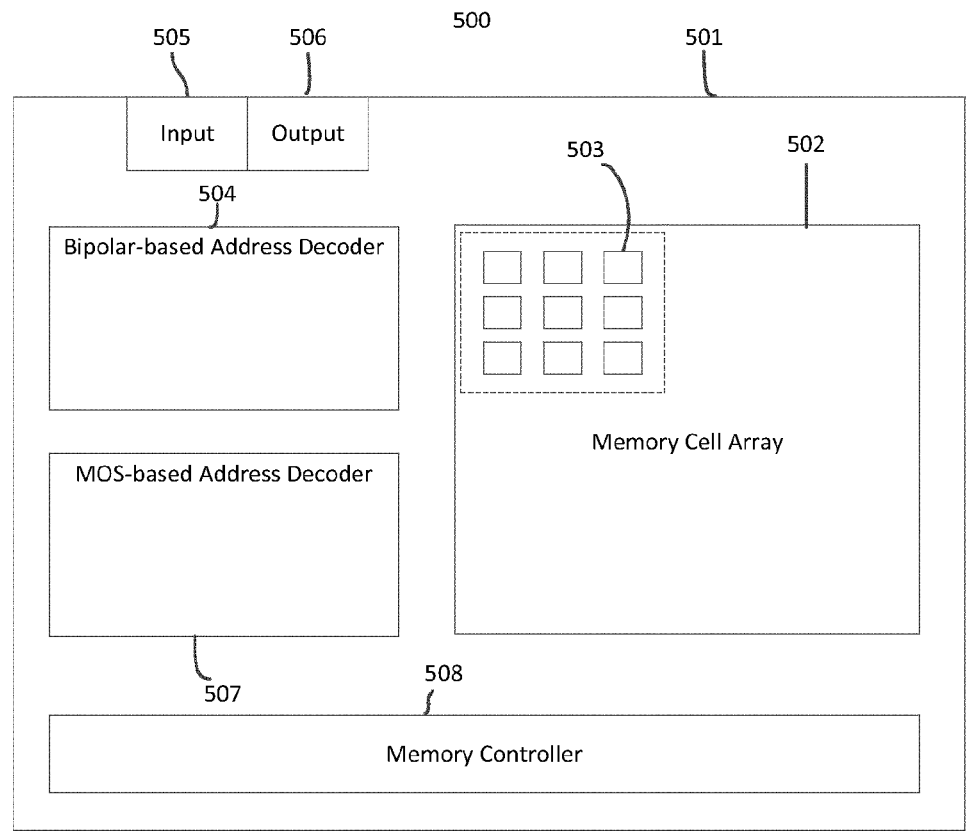
FIG. 5 is a block diagram of a system for using alternatively selectable MOS-based and bipolar-based address decoders in a MOS-based memory, a memory cell array, a MOS-based address decoder, a bipolar-based address decoder, and a memory controller, configured for using the systems and methods of this disclosure, shown according to an exemplary embodiment.

Referring to FIG. 5, a system 500 is shown for using alternatively selectable MOS-based and bipolar-based address decoders, 507 and 504, respectively, in MOS-based memory 501, configured for using the systems of this disclosure. Memory cell array 502, memory cells 503, input 505, output 506, and memory controller 508 are also shown. MOS-based memory 501 may be configured as static random-access memory (SRAM), dynamic random-access memory (DRAM), or any other suitable random-access memory (RAM) configuration. MOS-based memory 501 includes all components and circuitry necessary to facilitate communications between the various modules of the memory (e.g., memory cell array 502, memory cells 503, bipolar-based address decoder 504, input 505, output 506, MOS-based address decoder 507, memory controller 508, etc.)

MOS-based memory 501, memory cell array 502, memory cells 503, bipolar-based address decoder 504, input 505, output 506, and MOS-based address decoder 507 may be configured as MOS-based memory 401, memory cell array 402, memory cells 403, bipolar-based address decoder 404, input 405, output 406, and MOS-based address decoder 407 of FIG. 4, respectively, as described herein.

MOS-based memory 501 includes memory controller 508. Memory controller 508 may be configured to perform the operations as performed by memory controller 307 of FIG. 3 described herein (e.g., selecting the gate delays of the bipolar transistor devices, etc.). Memory controller 508 is also configured to control the selection between bipolar-based address decoder 504 and MOS-based address decoder 507.

In an exemplary embodiment, memory controller 508 accepts an input from input 505. The input is used by memory controller 508 to dynamically select between bipolar-based address decoder 504 and MOS-based address decoder 507. For example, memory controller 508 may use the input to deactivate bipolar-based address decoder 504, and to activate MOS-based address decoder 507. The input may be of any type acceptable for use by memory controller 508 (e.g., a selection bit, a selection byte, a selection instruction, etc.). The input may be static or dynamic.

In an exemplary embodiment, input 505 provides a selection input to memory controller 508. For example, MOS-based memory 501 may be coupled to the motherboard of a computer. The processor of the computer may generate and send a selection input to input 505. Memory controller 508 may accept the selection input and generate the appropriate signals to select between bipolar-based address decoder 504 and MOS-based address decoder 507. In another exemplary embodiment, the selection input may be generated and sent by a basic-input-output-system (BIOS). In yet another embodiment, the selection input may be generated by software. The software may automatically generate a selection input, or the selection input may be based on user settings.

In an exemplary embodiment, memory controller 508 dynamically adjusts a selection input. In this manner, memory controller 508 dynamically selects between bipolar-based address decoder 504 and MOS-based address decoder 507. In one example, memory controller 508 may adjust the selection input during a memory operation. In another example, memory controller 508 may adjust a selection input in between a memory operation. Memory controller 508 may be further configured to actively monitor MOS-based memory 501. Memory controller 508 may use data collected during monitoring to adjust the selection input. For example, memory controller 508 may adjust the selection input based on operational needs for a calculation. In another example, memory controller 508 may adjust the selection input based on a timing or synchronization calculation. In another example, memory controller 508 may adjust the selection input based on a power dissipation calculation.

In an exemplary embodiment, MOS-based memory 501 is the RAM of a mobile device. Memory controller 508 is configured to generate a selection input according to a power scheme of the mobile device. For example, if the mobile device is running on battery power, memory controller 508 may generate a selection input such that MOS-based address decoder 507 is activated for use, and bipolar-based address decoder 504 is deactivated. In this manner, battery life may be conserved. In the same example, if the mobile device is plugged into a power source (e.g., a power adapter connected to a power outlet), memory controller 508 may generate a selection input such that MOS-based address decoder 507 is deactivated for use, and bipolar-based address decoder 504 is activated for use. In this manner, memory performance and speed may be optimized.

It should be understood that the scope of the present application is not limited to a certain scenario or selection configuration of bipolar-based address decoder 504 and MOS-based address decoder 507.

Figure 6:
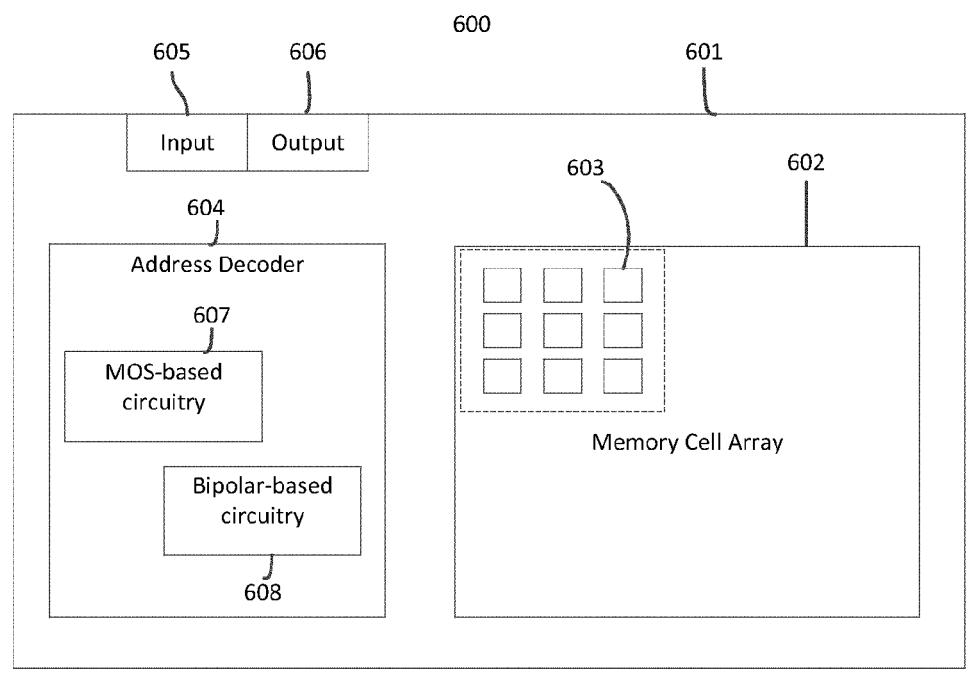
FIG. 6 is a block diagram of a system for using both MOS-based and bipolar-based decoding circuitry in an address decoder for MOS-based memory, configured for using the systems and methods of this disclosure, shown according to an exemplary embodiment.

Referring to FIG. 6, a system 600 is shown for using both MOS-based and bipolar-based decoding circuitry, 607 and 608, respectively, in address decoder 604 of MOS-based memory. Memory cell array 602, memory cells 603, input 605, and output 606 are also shown. MOS-based memory 601 may be configured as static random-access memory (SRAM), dynamic random-access memory (DRAM), or any other suitable random-access memory (RAM) configuration. MOS-based memory 601 includes all components and circuitry necessary to facilitate communications between the various modules of the memory (e.g., memory cell array 602, memory cells 603, address decoder 604, input 605, output 606, MOS-based circuitry 607, and bipolar logic circuitry 608, etc.)

MOS-based memory 601, memory cell array 602, memory cells 603, input 605, and output 606, may be configured as MOS-based memory 101, memory cell array 102, memory cells 103, input 105, and output 106 of FIG. 1, respectively, as described herein.

Address decoder 604 may perform the same operations as the address decoders described within the present application (e.g. accepting a word, decoding the word, and accessing a memory cell array). Address decoder 604 may also be an n-to-$2^n$ decoder. For example, address decoder 604 may be a 2-to-4 decoder, a 3-to-8 decoder, or a 4-to-16 decoder, etc. As another example, address decoder 604 may be a 3-to-8 decoder that is formed from two 2-to-4 decoders. Address decoder 604 may be a row decoder or a column decoder, and may be may be either a static or dynamic decoder.

Address decoder 604 is shown as containing both MOS-based circuitry 607 and bipolar logic circuitry 608. MOS-based circuitry 607 includes any number of MOSFET transistor devices, configured to implement CMOS logic gates. The logic gates may be multi-port logic gates. Any suitable CMOS logic gate may be used. Bipolar logic circuitry 608 includes any number of bipolar transistor devices, configured to implement logic gates, as described herein. MOS-based circuitry 607 and bipolar logic circuitry 608 may be used in different portions of address decoder 604. In an exemplary embodiment, MOS-based circuitry 607 and bipolar logic circuitry 608 are used to decode different bits of a word. For example, MOS-based circuitry 607 may be used to decode the high order bits of a word, and bipolar logic circuitry 608 may be used to decode the low order bits of the word. In another exemplary embodiment MOS-based circuitry 607 and bipolar logic circuitry 608 are used for different stages of a multi-stage decoder. For example MOS-based circuitry 607 may be used for lower order stages which require more transistors than higher stages, and bipolar logic circuitry 608 may be used for the higher order stages which require less transistors than lower stages (which therefore require less area and invoke less power dissipation).

The selection of specific MOS-based circuitry 607 and bipolar logic circuitry 608 may be determined during the design process. For example, customer may require a memory device with particular speed and power dissipation requirements. The requirements may determine the selection of MOS-based circuitry 607 and bipolar logic circuitry 608. In another example, the selection of MOS-based circuitry 607 and bipolar logic circuitry 608 may be determined by layout concerns for a particular application. As described herein, MOS-based memory 601 may include any number of address decoders 604. Each address decoder 604 may have a different arrangement of MOS-based circuitry 607 and bipolar logic circuitry 608. Address decoder 604 may be entirely MOS-based circuitry 607 or entirely bipolar logic circuitry 608.

In an exemplary embodiment, MOS-based memory 601 is fabricated with both MOS-based circuitry 607 and bipolar logic circuitry 608 for each address decoder 604. As an example, selection of MOS-based circuitry 607 and bipolar logic circuitry 608 may be made by the connection or disconnection of either type of circuitry.

MOS-based memory 601 includes input 605 and output 606. Output 606 is configured to provide an output to a device as described herein. For example, output 106 may be coupled to a PC motherboard. The motherboard may be configured to use data provided through output 606. In another example, output 606 may be coupled to a logic board of a peripheral device. Input 605 is configured to receive data from an electronic device. In an exemplary embodiment, input 605 and output 606 are coupled to the pin connectors of a RAM module.

Figure 7A:
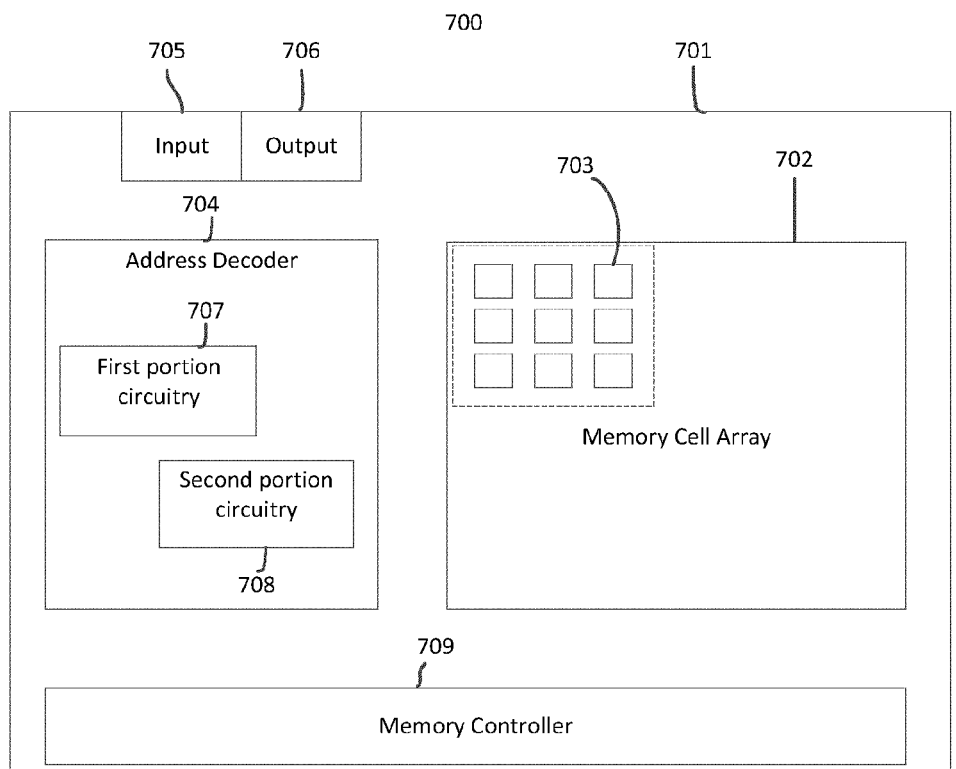
FIG. 7a is a block diagram of a system for using both MOS-based and bipolar-based decoding circuitry in an address decoder for MOS-based memory, including a memory controller, configured for using the systems and methods of this disclosure, shown according to an exemplary embodiment.
Figure 7B:
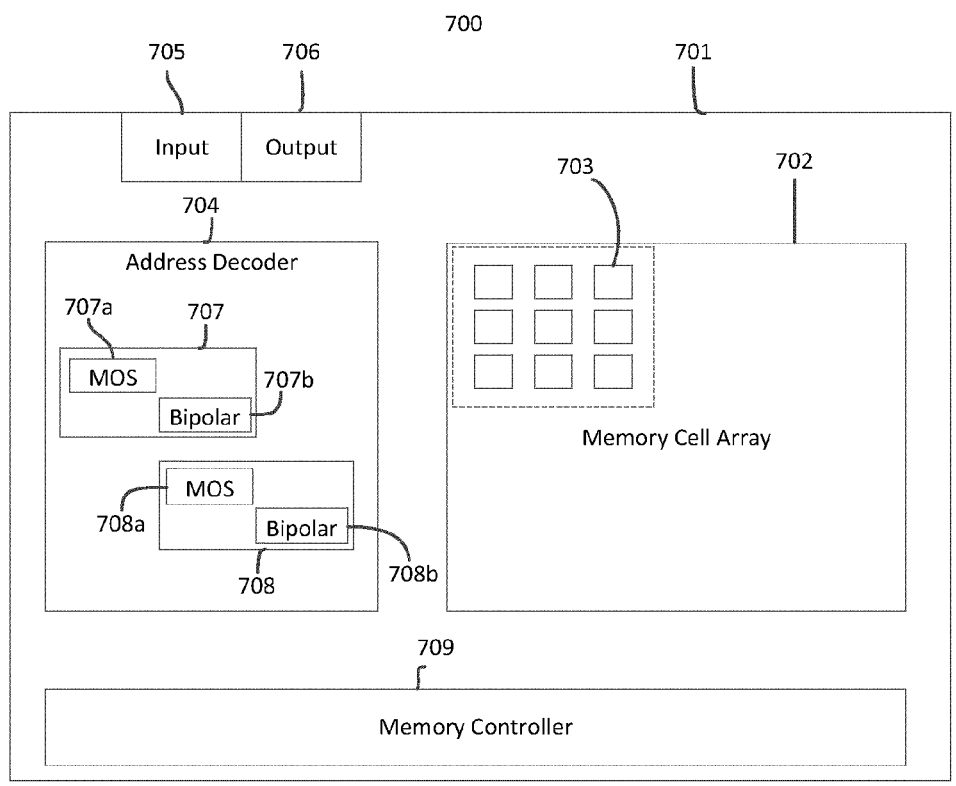
FIG. 7b is a block diagram of a system for using both MOS-based and bipolar-based decoding circuitry in an address decoder for MOS-based memory, including a memory controller, configured for using the systems and methods of this disclosure, shown according to an exemplary embodiment.

Referring to FIGS. 7a and 7b, a system 700 is shown for using a first and a second portion of decoding circuitry, 707 and 708, respectively, in address decoder 704 of MOS-based memory 701. Memory cell array 702, memory cells 703, input 705, output 706, and memory controller 709 are also shown. MOS-based memory 701 may be configured as static random-access memory (SRAM), dynamic random-access memory (DRAM), or any other suitable random-access memory (RAM) configuration. MOS-based memory 701 includes all components and circuitry necessary to facilitate communications between the various modules of the memory (e.g., memory cell array 702, memory cells 703, address decoder 704, input 705, output 706, first portion circuitry 707, second portion circuitry 708, and memory controller 709, etc.) First portion circuitry 707 and second portion circuitry 708 are used to perform different aspects of the decoding. In an exemplary embodiment, first portion circuitry 707 and second portion circuitry 708 are used to decode different bits of a word. In another exemplary embodiment first portion circuitry 707 and second portion circuitry 708 are used for different stages of a multi-stage decoder. In an exemplary embodiment, first portion circuitry 707 comprises MOS-based circuitry, and second portion circuitry 708 comprises bipolar logic circuitry. In another embodiment (as depicted in FIG. 7b), first portion circuitry 707 may comprise two alternatively selectable versions, one comprising MOS-based circuitry 707a, and the other comprising bipolar logic circuitry 707b. In another embodiment (as depicted in FIG. 7b), second portion circuitry 708 may comprise two alternatively selectable versions, one comprising MOS-based circuitry 708a, and the other comprising bipolar logic circuitry 708b. It should be understood that various configurations of first portion circuitry 707 and second portion circuitry 708 are envisioned.

MOS-based memory 701, memory cell array 702, memory cells 703, address decoder 704, input 705, output 706, first portion circuitry 707, and second portion circuitry 708 may be configured as MOS-based memory 601, memory cell array 602, memory cells 603, address decoder 604, input 605, output 606, MOS-based circuitry 607, and bipolar logic circuitry 608 of FIG. 6, respectively, as described herein. Address decoder 704 is further configured to accept a selection input to select between MOS-based circuitry and bipolar logic circuitry versions of first portion circuitry 707 and/or second portion circuitry 708.

MOS-based memory 701 includes memory controller 709. Memory controller 709 may be configured to perform the operations as performed by memory controller 307 of FIG. 3 described herein (e.g., selecting the gate delays of the bipolar transistor devices, etc.). Memory controller 709 may be further configured to accept a selection input from input 705. The selection input is used by memory controller 709 to dynamically select between MOS-based circuitry and bipolar logic circuitry versions of first portion circuitry 707 and/or second portion circuitry 708. For example, memory controller 709 may use the input to deactivate MOS-based circuitry 707a, and to activate bipolar logic circuitry 707b. The input may be of any type acceptable for use by memory controller 709 (e.g., a selection bit, a selection byte, a selection instruction, etc.). The input may be static or dynamic.

In an exemplary embodiment, input 705 provides a selection input to memory controller 709. For example, MOS-based memory 701 may be coupled to the motherboard of a laptop. The processor of the laptop may generate and send a selection input to input 705. Memory controller 709 may accept the selection input and generate the appropriate signals to select between MOS-based circuitry and bipolar logic circuitry versions of first portion circuitry 707 and/or second portion circuitry 708. In another exemplary embodiment, the selection input may be generated by a BIOS. In yet another embodiment, the selection input may be generated by software. The software may automatically generate a selection input as the result of an algorithm, or the software made send a selection input based on user settings.

In an exemplary embodiment, memory controller 709 dynamically adjusts a selection input. By dynamically adjusting the selection input, memory controller 709 may dynamically select either MOS-based circuitry or bipolar logic circuitry versions of first portion circuitry 707 and/or second portion circuitry 708, or any combination therein. In one example, memory controller 709 may adjust the selection input during a memory operation. In another example, memory controller 709 may adjust the selection input in between a memory operation. Memory controller 709 may be further configured to actively monitor MOS-based memory 701. Memory controller 709 may use data collected during monitoring to adjust the selection input. For example, memory controller 709 may adjust the selection input based on operational needs for a calculation. In another example, memory controller 709 may adjust the selection input based on a timing or synchronization calculation. In another example, memory controller 709 may adjust the selection input based on a power dissipation calculation.

In an exemplary embodiment, MOS-based memory 701 is the RAM of a cellular phone (e.g., a smart phone, etc.). Memory controller 709 is configured to generate a selection input according to the battery charge of the cellular phone. For example, if the cellular phone is running low on battery charge, memory controller 709 may generate a selection input such that address decoder 704 uses MOS-based circuitry 707a, as opposed to bipolar logic circuitry 707b within first portion circuitry 707; but may nonetheless decide to use bipolar logic circuitry 708b within the second portion circuitry 708. In this manner, battery life of the cellular phone may be conserved while still utilizing speed advantages associated with use of bipolar logic circuitry 708b. In the same example, if the cellular phone device is plugged into a power source (e.g., a power adapter connected to a power outlet), memory controller 709 may generate a selection input such that address decoder 704 uses bipolar logic circuitry 707b and 708b, as opposed to MOS-based circuitry 707a and 708a. In this manner, memory performance and speed may be optimized while the cellular phone is plugged in.

It should be understood that the scope of the present application is not limited to a certain scenario or selection of MOS-based circuitry 707 and bipolar logic circuitry 708.

Figure 8:
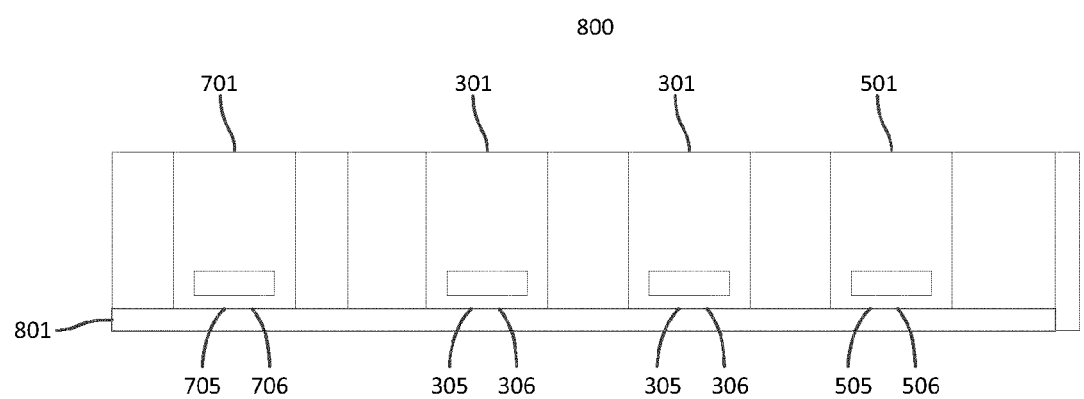
FIG. 8 is a schematic diagram of a RAM memory chip constructed using the systems described herein, shown according to an exemplary embodiment.

Referring to FIG. 8, a schematic diagram of RAM memory chip 800 constructed using the systems described herein is shown. RAM memory chip 800 contains MOS-based memory 701, MOS-based memory 301, and MOS-based memory 501, each as described herein, configured for use on a single chip. Inputs 705, 305, and 505, and outputs 706, 306, and 506 are also shown. The inputs and outputs are shown as being coupled to the pins 801 of memory chip 800. Pins 801 may be configured to provide suitable input and output to and from MOS-based memories 701, 301, and 501. It should be understood that the scope of the present application is not limited to a certain combination of memory devices. In an exemplary embodiment, RAM memory chip 800 is the RAM memory of an electronic device. For example, RAM memory chip 800 may be a 2 GB DRAM chip coupled to the motherboard of a desktop computer. As another example, memory chip 800 may be a 1 GB DRAM chip coupled to the motherboard of a laptop computer.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures may show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule-based logic and other logic to accomplish the various connection steps, processing steps, comparison steps and decision steps.

What is claimed is:

1. A system, comprising:
   a MOS-based memory, comprising:
      an array of a plurality of memory cells configured to store data;
      a MOS-based address decoder configured to:
         accept a word comprising a plurality of bits; and
         access the array of memory cells using the word;
      a bipolar-based address decoder comprising bipolar logic circuitry, wherein the bipolar-based address decoder is configured to:
         accept a word comprising a plurality of bits; and
         access the array of memory cells using the word; and
      memory controller circuitry configured to:
         accept a selection input; and
         use the selection input to select between the MOS-based address decoder and the bipolar-based address decoder.

2. The system of claim 1, wherein the bipolar logic circuitry comprises a plurality of bipolar transistor devices, wherein at least one bipolar transistor device has an adjustable gate bias and is configured to accept an input, wherein the gate bias is adjusted based on the input, wherein the gate bias determines a selectable gate delay.

3. The system of claim 1, wherein the selection input is a selection bit.

4. The system of claim 1, wherein the selection input is a static input.

5. The system of claim 1, wherein the selection input is provided by a PC board.

6. The system of claim 1, wherein the selection input is provided by a BIOS.

7. The system of claim 1, wherein the selection input is a dynamic input.

8. The system of claim 1, wherein the selection input is provided by software.

9. The system of claim 1, wherein the selection input is adjusted either during or between a memory operation.

10. The system of claim 1, wherein the selection input is based on a power dissipation calculation.

11. The system of claim 1, wherein the selection input is based on a timing or synchronization calculation.

12. The system of claim 1, wherein the selection input is based on operational needs for a calculation.

13. The system of claim 1, wherein the bipolar logic circuitry uses BiCMOS devices.

14. The system of claim 1, wherein the MOS-based address decoder is a row decoder.

15. The system of claim 1, wherein the MOS-based address decoder is a column decoder.

16. The system of claim 1, wherein the bipolar-based address decoder is a row decoder.

17. The system of claim 1, wherein the bipolar-based address decoder is a column decoder.

18. The system of claim 1, wherein the bipolar-based address decoder is a static decoder.

19. The system of claim 1, wherein the bipolar-based address decoder is a dynamic decoder.

* * * * *